US012717240B2

(12) United States Patent
Saito et al.

(10) Patent No.: US 12,717,240 B2
(45) Date of Patent: Aug. 25, 2026

(54) LIGHT SOURCE APPARATUS, LITHOGRAPHY APPARATUS, AND ARTICLE MANUFACTURING METHOD

(71) Applicant: CANON KABUSHIKI KAISHA, Tokyo (JP)

(72) Inventors: Mahiro Saito, Tochigi (JP); Mizuma Murakami, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 254 days.

(21) Appl. No.: 18/342,637

(22) Filed: Jun. 27, 2023

(65) Prior Publication Data

US 2024/0004306 A1 Jan. 4, 2024

(30) Foreign Application Priority Data

Jun. 30, 2022 (JP) ................................ 2022-106241

(51) Int. Cl.
*G03F 7/00* (2006.01)

(52) U.S. Cl.
CPC ...... *G03F 7/70316* (2013.01); *G03F 7/70891* (2013.01)

(58) Field of Classification Search
CPC ............. G03F 7/70016; G03F 7/70316; G03F 7/70808; G03F 7/70891; G03F 7/2008; G03F 7/7015; F21V 11/06; F21V 29/773; F21V 29/77
See application file for complete search history.

(56) References Cited

U.S. PATENT DOCUMENTS

| | | | | |
|---|---|---|---|---|
| 4,747,028 A * | 5/1988 | Piotrovsky | F21V 11/06 | 428/116 |
| 2002/0097205 A1* | 7/2002 | Nakamura | G03F 7/70016 | 345/82 |
| 2007/0183053 A1* | 8/2007 | Ellemor | E06B 9/24 | 359/873 |
| 2008/0283779 A1* | 11/2008 | Tran | G03F 7/70908 | 250/504 R |
| 2011/0205756 A1* | 8/2011 | Kim | G02B 6/0053 | 362/607 |

FOREIGN PATENT DOCUMENTS

| | | |
|---|---|---|
| CN | 203836648 U * | 9/2014 |
| CN | 216480786 U * | 5/2022 |
| JP | 2001318428 A | 11/2001 |
| JP | 2004354655 A | 12/2004 |

(Continued)

OTHER PUBLICATIONS

Machine translation of JP 2005274730, Oct. 16, 2005.*

*Primary Examiner* — Peter B Kim
(74) *Attorney, Agent, or Firm* — Canon U.S.A., Inc., IP Division

(57) ABSTRACT

A light source apparatus includes a light source, a first housing configured to store the light source, a planar surface of the first housing including a plurality of openings communicating with an outside of the first housing, and a plurality of portions, disposed on the planar surface, each having an inclined plane inclining with respect to the planar surface. At least one of the plurality of portions reflects light from the light source, causing the reflected light to exit the first housing through at least one of the plurality of openings.

18 Claims, 11 Drawing Sheets

(56) References Cited

FOREIGN PATENT DOCUMENTS

| | | | |
|---|---|---|---|
| JP | 2005274730 | A | 10/2005 |
| JP | 2009237237 | A | 10/2009 |
| JP | 2011013512 | A | 1/2011 |
| KR | 20130022404 | A | 3/2013 |
| TW | 202219652 | A | 5/2022 |
| WO | 2019107249 | A1 | 6/2019 |

* cited by examiner

LIGHT SOURCE APPARATUS, LITHOGRAPHY APPARATUS, AND ARTICLE MANUFACTURING METHOD

BACKGROUND

Field of the Disclosure

The present disclosure relates to a light source apparatus, a lithography apparatus, and an article manufacturing method.

Description of the Related Art

An exposure apparatus is used in a lithography process for manufacturing a device, such as a semiconductor device and a display device. An exposure apparatus exposes a substrate to light from a light source apparatus having a light source, such as a lamp. The output of the light source apparatus has been increased with the increase in size of substrates. Accordingly, it has become an important issue to prevent influences of radiation heat due to long-wavelength light contained in light from the light source apparatus.

Japanese Patent Application Laid-Open No. 2004-354655 discloses a disclosure related to an exposure mirror for reflecting light emitted from a light source to expose a substrate to light. The exposure mirror is attached with a cooling material on its base. On the surface of the base of the exposure mirror, a light absorption film is formed. On the top layer of the light absorption film, a short-wavelength light reflection film for selectively reflecting only predetermined short-wavelength light is formed.

A light source may be disposed inside the housing of a light source apparatus. The light from the light source is reflected by the housing, and the reflected light may illuminate the light source. If the light reflected by the housing illuminates the light source, the temperature of the light source may rise by radiant heat.

Japanese Patent Application Laid-Open No. 2004-354655 discusses the exhausting of heat reaching a housing and heated air by cooling the housing with a cooling unit, but does not discuss the prevention of a temperature rise of a light source illuminated by light reflected by the housing.

SUMMARY

The present disclosure is directed to providing a light source apparatus for preventing a temperature rise of a light source, a lithography apparatus, and an article manufacturing method.

According to an aspect of the present disclosure, a light source apparatus includes a light source, a first housing configured to store the light source, a planar surface of the first housing including a plurality of openings communicating with an outside of the first housing, and a plurality of portions, disposed on the planar surface, each having an inclined plane inclining with respect to the planar surface. At least one of the plurality of portions reflects light from the light source, causing the reflected light to exit the first housing through at least one of the plurality of openings.

Further features of the present disclosure will become apparent from the following description of embodiments with reference to the attached drawings.

DESCRIPTION OF THE EMBODIMENTS

Figure 1:
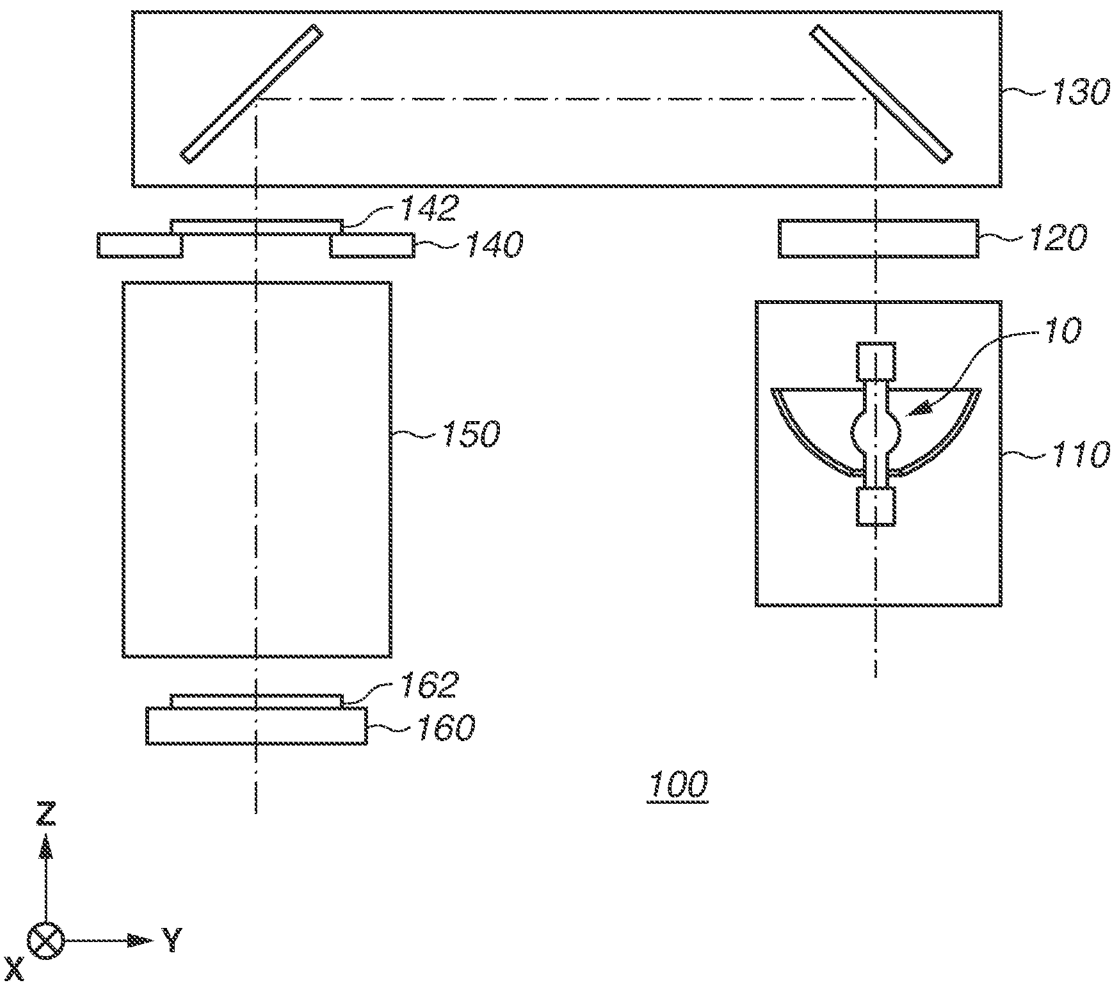
FIG. 1 illustrates a configuration of an exposure apparatus.

Exemplary embodiments will be described in detail below with reference to the accompanying drawings. The following embodiments do not limit the disclosure within the scope of the claims. Although a plurality of features is described in the embodiments, not all of the plurality of features is indispensable to the present disclosure, and the plurality of features can be combined in an arbitrary way. In the accompanying drawings, identical or similar components are assigned the same reference numerals, and duplicated descriptions thereof will be omitted.

A first embodiment will now be described. An exposure apparatus 100 as a lithography apparatus will be described first. FIG. 1 illustrates a configuration of the exposure apparatus 100. The exposure apparatus 100 includes, for example, a light source apparatus 110, a shutter apparatus 120, an illumination optical system 130, an original plate holding unit 140, a projection optical system 150, and a substrate holding unit 160. According to the present specification and the attached drawings, the direction along the optical axis of a mirror 50 included in the light source apparatus 110 (described below) is the Z-axis direction. The two different directions perpendicularly intersecting with each other along a planar surface perpendicular to the Z-axis direction are the X-axis and the Y-axis directions.

The original plate holding unit 140 holds an original plate 142. The original plate holding unit 140 is positioned by an original plate positioning mechanism (not illustrated), and the original plate 142 is positioned by the positioning of the original plate holding unit 140. The substrate holding unit 160 holds a substrate 162. The substrate 162 applied with a resist (photosensitive material) by a resist application apparatus is supplied to the exposure apparatus 100. The substrate holding unit 160 is positioned by a substrate positioning mechanism (not illustrated). The substrate 162 is positioned by the positioning of the substrate holding unit 160.

The shutter apparatus 120 is disposed so as to interrupt the light flux on the optical path between the light source apparatus 110 and the original plate holding unit 140. The illumination optical system 130 illuminates the original plate 142 by using light from the light source apparatus 110. The projection optical system 150 projects the pattern of the original plate 142 illuminated by the illumination optical system 130 to the substrate 162. Thus, the substrate 162 is exposed to light. A latent image pattern is thereby formed on the resist applied to the substrate 162. The latent image pattern is developed by a development apparatus (not illustrated), and a resist pattern is thereby formed on the substrate 162.

Figure 2:
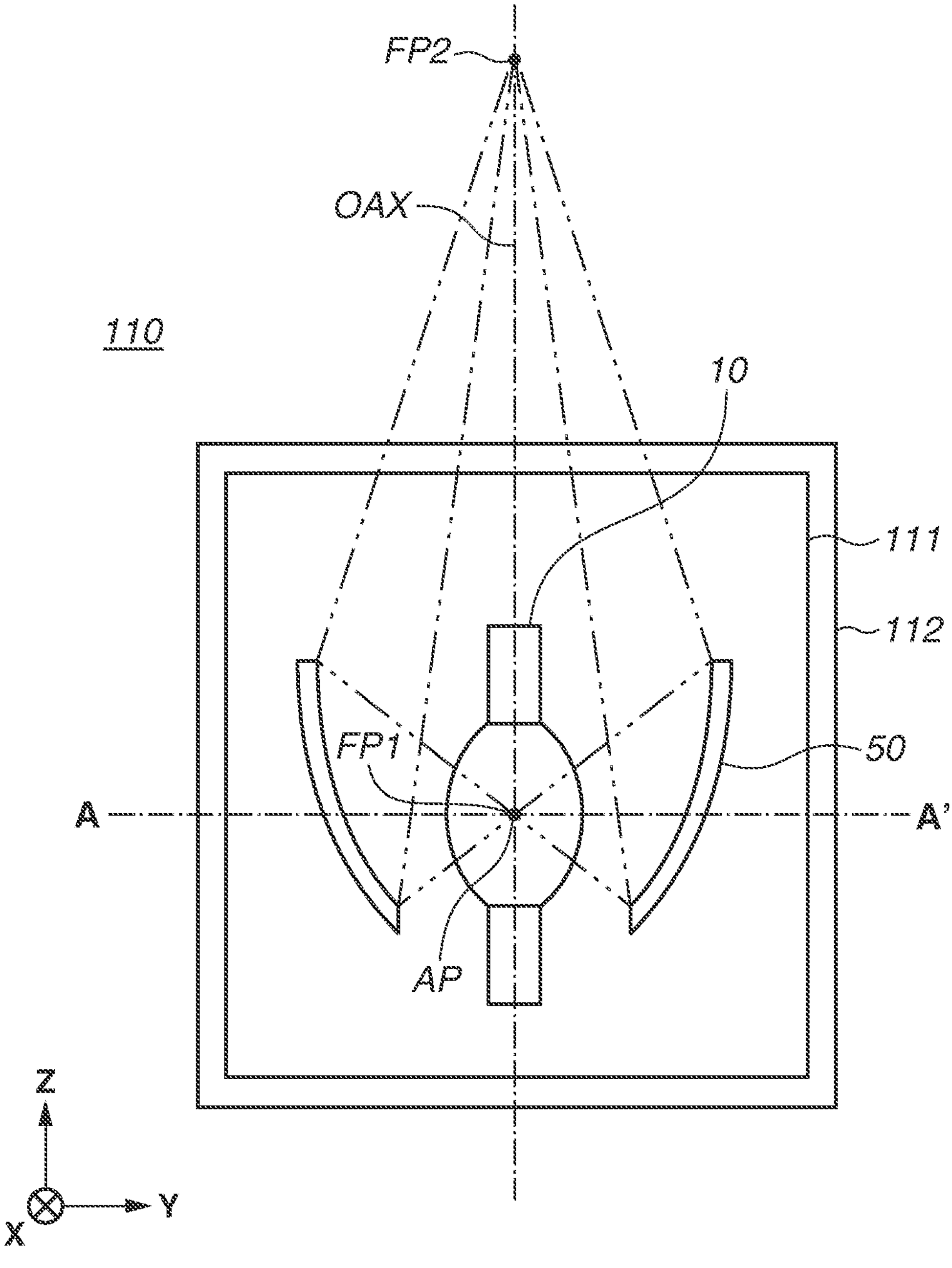
FIG. 2 illustrates a configuration of a light source apparatus according to a first embodiment.

The light source apparatus 110 will now be described below with reference to FIG. 2. FIG. 2 illustrates a configuration of the light source apparatus 110 according to the present embodiment. The light source apparatus 110 includes a lamp 10 as a light source, a mirror 50 for focusing the light produced by the lamp 10, a first housing 111 for storing the lamp 10, and a second housing 112 for storing the first housing 111.

Examples of the lamp 10 include a mercury lamp, xenon lamp, metal halide lamp, and other short arc type lamps. The mirror 50 can be an ellipse mirror having a first focal point FP1 and a second focal point FP2 positioned on an optical axis OAX of the mirror 50. The optical axis OAX of the mirror 50 is an axis line connecting the first focal point FP1 and the second focal point FP2.

The lamp 10 is disposed on the optical axis OAX. A bright spot AP of the lamp 10 is disposed at the first focal point FP1 or the vicinity thereof. The mirror 50 reflects the light emitted from the bright spot AP to focus the light at the second focal point FP2. The mirror 50 is a cold mirror applied with a thin optical film that transmits long-wavelength light, such as infrared light, and reflects short-wavelength light, such as visible and ultraviolet light. The diameter of the opening of the mirror 50 is, for example, 300 to 400 mm depending on the size of the lamp 10. The mirror 50 can be a parabola mirror that emits reflected light in parallel.

The light emitted from the lamp 10 can possibly be reflected by a planar surface of the first housing 111 facing the lamp 10 and irradiate the lamp 10. Since the light from the lamp 10 contains long-wavelength light, such as infrared light, a temperature of the lamp 10 may increase by being irradiated by the reflected light. Since a temperature increase of the lamp 10 may shorten the life of the lamp 10, preventing the temperature increase of the lamp 10 is important.

According to the present embodiment, there is thus disposed a plurality of portions bonded to the planar surface that is facing the lamp 10 of the first housing 111, and having inclined planes inclining with respect to the planar surface.

Figure 3A:
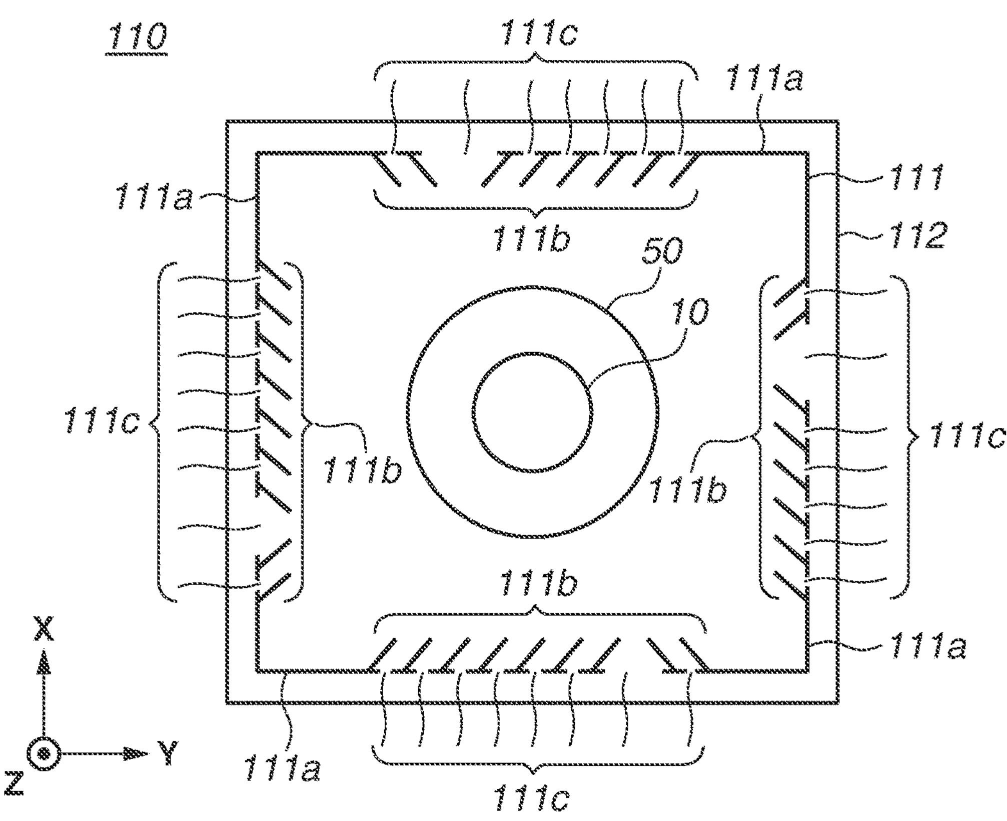
FIGS. 3A and 3B are cross-sectional views illustrating the light source apparatus according to the first embodiment.
Figure 3B:
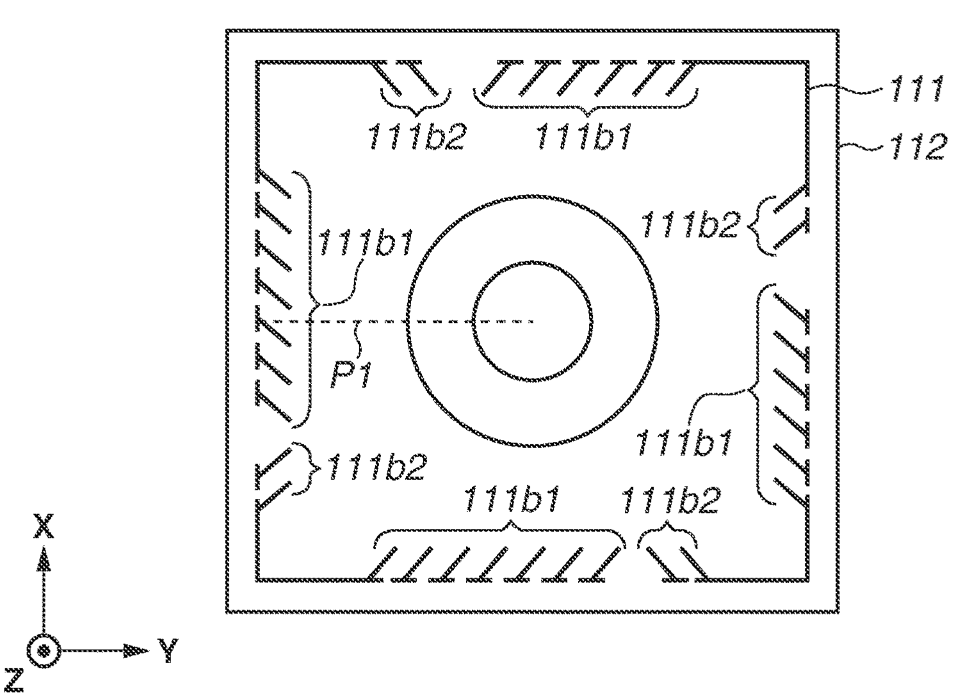
Figure 4:
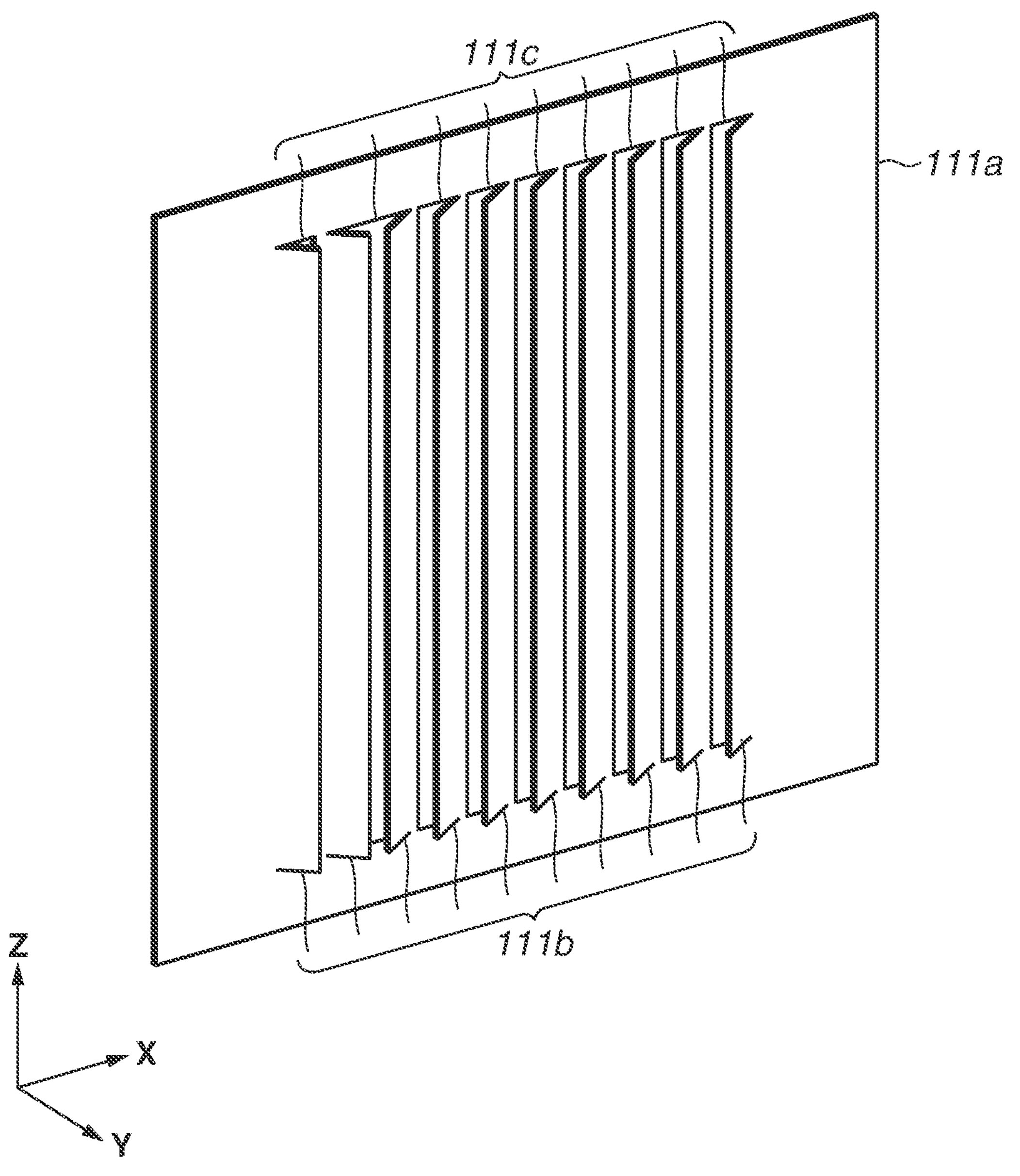
FIG. 4 is a perspective view illustrating a first housing of the light source apparatus according to the first embodiment.

FIGS. 3A and 3B are cross-sectional views illustrating the light source apparatus 110 according to the present embodiment. FIGS. 3A and 3B are plan views when the cross-section AA' in FIG. 2 is viewed from above. FIG. 4 is a perspective view illustrating the first housing of the light source apparatus 110 according to the present embodiment. As illustrated in FIGS. 3A and 4, the first housing 111 has a planar surface 111*a* facing the lamp 10. The first housing 111 has a plurality (set) of portions 111*b* having planes (inclined planes) bonded to the planar surface 111*a* and inclining with respect to the planar surface 111*a*. The plurality of portions 111*b* is arranged in line in the X-axis direction and disposed on the planar surface 111*a*. The plurality of portions 111*b* illustrated in FIG. 4 is arranged in line in the X-axis direction, but the plurality of portions 111*b* on another surface is arranged in line in the Y-axis direction and disposed on the planar surface 111*a*.

Each of the plurality of portions 111*b* is bonded to the planar surface 111*a* and has an inclined plane inclining with respect to the planar surface 111*a*. Each portion 111*b* is disposed at such a position that the lamp 10 does not exist in the normal direction of the inclined plane. This means that none of the inclined planes of the plurality of portions 111*b* faces the lamp 10. According to the present embodiment, each of the plurality of portions 111*b* has a plate-like shape.

Figure 5:
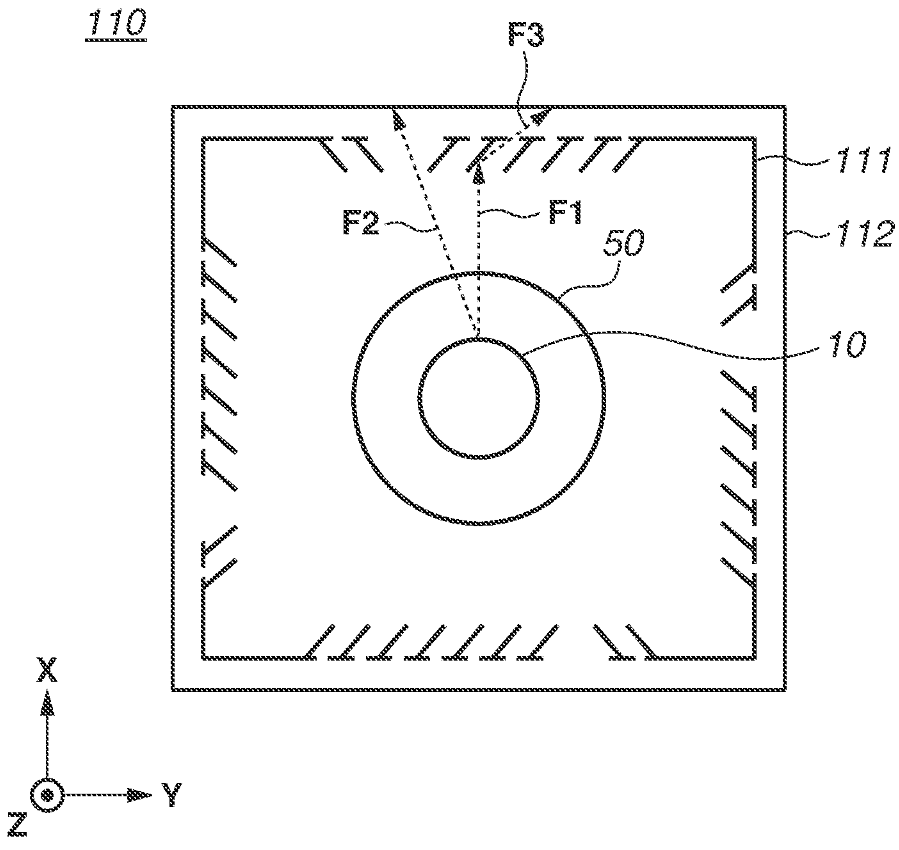
FIG. 5 illustrates an example of an optical path of light emitted from a lamp.

The plurality of portions 111*b* on the first housing 111 prevents the light emitted from the lamp 10 from being reflected by the first housing 111 and irradiating the lamp 10. FIG. 5 illustrates an example of an optical path of the light emitted from the lamp 10. FIG. 5 is similar to FIG. 3A, and thus some of reference numerals, such as the planar surface 111*a*, are omitted. Referring to FIG. 5, light F1 emitted from the lamp 10 penetrates the mirror 50 or passes over the mirror 50 and then reaches the first housing 111. The light F1 is reflected by the inclined plane of one of the plurality of portions 111*b* but is not reflected in a direction toward the lamp 10. Thus, the light F1 does not irradiate the lamp 10. The reflected light is attenuated while being diffusely reflected. The reflected light is also attenuated while repetitively being reflected inside the first housing 111. This reduces the possibility that the light emitted from the lamp 10 returns to the lamp 10 to irradiate the lamp 10. More specifically, the plurality of portions 111*b* reduces the possibility that the light emitted from the lamp 10 returns to the lamp 10 to irradiate the lamp 10. This means that the first housing 111 having the plurality of portions 111*b* enables preventing a temperature increase of the lamp 10.

Since the plurality of portions 111*b* reduces the possibility that the light reflected by the inclined planes irradiates the lamp 10, it is desirable that the inclined planes are disposed at an angle of 10 to 80 degrees with respect to the planar surface 111*a*. It is more desirable that the plurality of portions 111*b* is disposed so that the inclined planes are disposed at an angle of 30 to 60 degrees with respect to the planar surface 111*a*.

It is also desirable that some of the plurality of portions 111*b* are disposed at an angle different from the angle of others of the plurality of portions 111*b*. As illustrated in FIG. 3B, like a plurality of portions 111*b*1 and a plurality of portions 111*b*2, it is desirable that the plurality of portions 111*b* having inclined planes is disposed at a different angle with respect to the planar surface 111*a*. This arrangement enables preventing the inclined planes of some of the plurality of portions 111*b* from being disposed to face the lamp 10. It is also desirable that the position of the boundary between the plurality of portions 111*b*1 and the plurality of portions 111*b*2 is deviated from the position on the straight line P1 perpendicular to a planar surface parallel to the planar surface 111*a*, passing through the center of the lamp 10. This arrangement aims for preventing the light that is emitted from an opening 111*c* positioned at the boundary between the plurality of portions 111*b*1 and the plurality of portions 111*b*2, from being reflected by the second housing 112 and irradiating the lamp 10.

On the planar surface 111*a* of the first housing 111, a plurality of openings 111*c* is formed. The plurality of openings 111*c* allows the space (first space) inside the first housing 111 to communicate with the space (second space) outside the first housing 111 and inside the second housing 112. The second space is the space between the first and the second housings. For example, light F2 emitted from the lamp 10 penetrates the mirror 50 or passes over the mirror 50, and then reaches the first housing 111. If the incident angle of the light F2 is larger than 0 with respect to the planar surface 111*a*, the light F2 is attenuated while being reflected between the first housing 111 and the second housing 112. This reduces the possibility that the light emitted from the lamp 10 returns to the lamp 10 to irradiate the lamp 10. This means that the first housing 111 having the plurality of openings 111*c* enables preventing a temperature increase of the lamp 10.

It is desirable that each of the plurality of openings 111*c* is disposed between the plurality of portions 111*b*. As illustrated in FIG. 5, light F3 reflected by the inclined plane of one of the plurality of portions 111*b* exits the first housing 111 through an opening 111*c* disposed between the plurality of portions 111*b*. Thus, the light F3 does not irradiate the lamp 10. This means that disposing each of the plurality of openings 111*c* between the plurality of portions 111*b* enables preventing a temperature increase of the lamp 10.

The first housing 111 illustrated in FIGS. 3A and 3B includes the plurality of portions 111*b* and the plurality of openings 111*c* disposed on the four different lateral planes facing the lamp 10. However, the present disclosure is not limited to this form. The plurality of portions 111*b* and the plurality of openings 111*c* need to be disposed on at least one of the plurality of lateral planes facing the lamp 10. The first housing 111 illustrated in FIGS. 3A and 3B includes the plurality of portions 111*b* and the plurality of openings 111*c* disposed on the lateral planes facing the lamp 10. However, the present disclosure is not limited to this form. There can be disposed an upper surface facing the lamp 10, a lower surface facing the lamp 10, or a plurality of portions 111*b* and a plurality of openings 111*c* on the upper and lower surfaces.

The plurality of portions 111*b* is disposed so that the inclined planes incline to the inside of the first housing 111, however, the plurality of portions 111*b* can be disposed so that the inclined planes incline to the outside of the first housing 111.

It is also desirable that the planar surface 111*a* of the first housing 111, the surfaces of the plurality of portions 111*b* including the inclined planes, and the inner surface of the second housing 112 are colored black to absorb light emitted from the lamp 10. It is also desirable that the planar surface 111*a* of the first housing 111, the surfaces of the plurality of portions 111*b* including the inclined planes, and the inner surface of the second housing 112 are rough and uneven surfaces with a low flatness to diffusely reflect the light emitted from the lamp 10.

The exposure apparatus 100 can be provided with a gas supply apparatus (not illustrated) connected with the light source apparatus 110 via a pipe. The gas supply apparatus supplies a gas with a temperature lower than the internal temperature of the light source apparatus 110 to the light source apparatus 110. The exposure apparatus 100 can also be provided with an exhaust air apparatus (not illustrated) connected with the light source apparatus 110 via a pipe. The exhaust apparatus exhausts from the inside of the light source apparatus 110 a gas heated by the light emitted from the lamp 10. These components enable further preventing a temperature increase of the lamp 10.

The light source apparatus 110 according to the present embodiment includes a housing provided with a plurality of portions each with a plate-like shape having a plane inclining with respect to a planar surface facing the light source. This configuration enables reducing the possibility that the light from the light source is reflected by the housing and the light irradiates the light source, thus preventing a temperature increase of the light source.

Figure 6A:
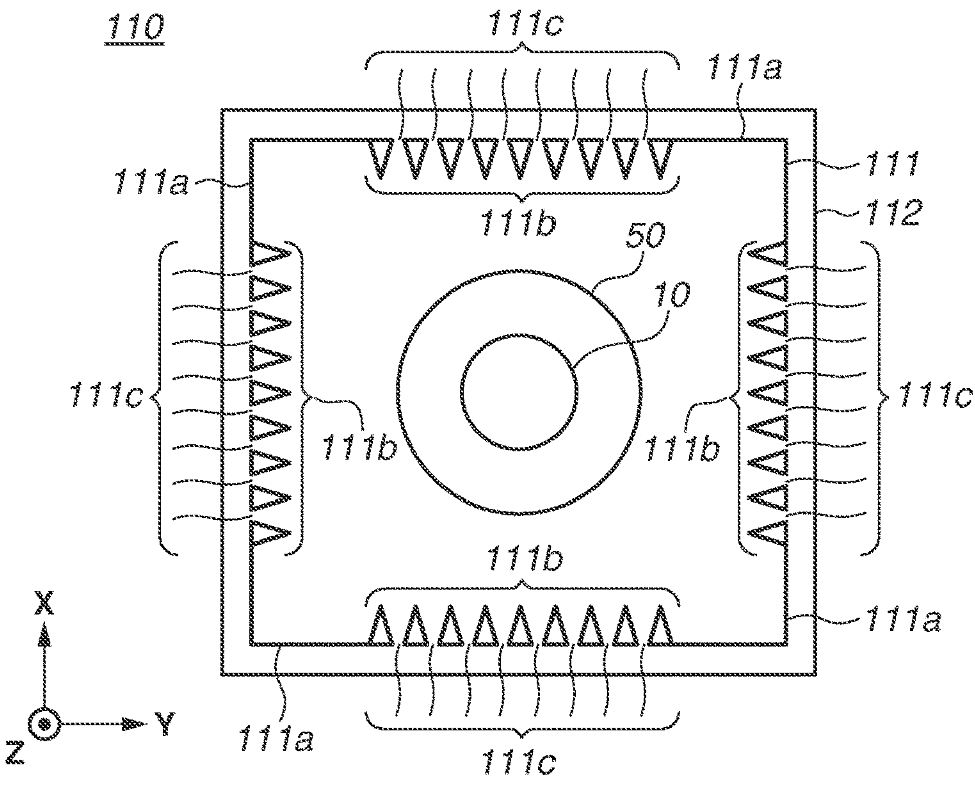
FIGS. 6A and 6B are cross-sectional views illustrating a light source apparatus according to a second embodiment.
Figure 6B:
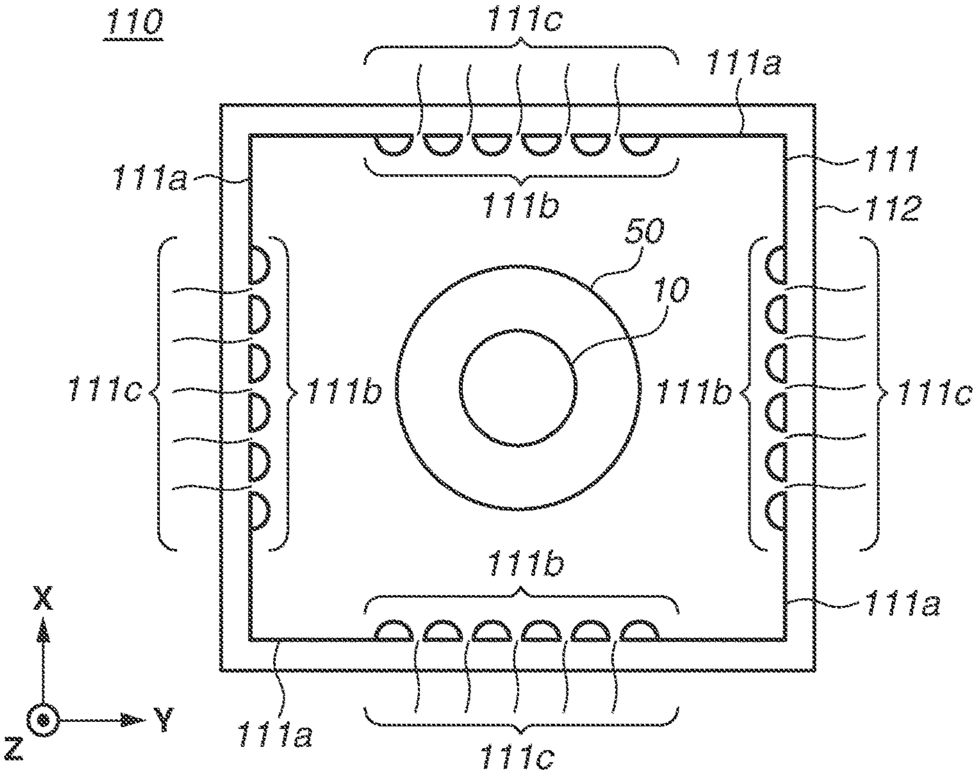

A light source apparatus 110 according to a second embodiment will now be described. Elements not mentioned as the second embodiment are inherited from the first embodiment. A light source apparatus 110 according to the second embodiment also includes a plurality (set) of portions 111*b* having inclined planes inclining with respect to a planar surface facing the lamp 10. Each portion 111*b* has a convex shape toward the lamp 10 (a convex shape protruding to the inside of the first housing 111). FIGS. 6A and 6B are cross-sectional views illustrating the light source apparatus 110 according to the present embodiment. Referring to FIG. 6A, each of the plurality of portions 111*b* has a convex shape of which the cross-sectional shape is a triangle. More specifically, each of the plurality of portions 111*b* has a convex shape of a cone or a pyramid, such as a circular cone, triangular pyramid, and quadrangular pyramid. Referring to FIG. 6B, each of the plurality of portions 111*b* has a convex shape of which the cross-sectional shape is a part of a circle or ellipse. More specifically, each of the plurality of portions 111*b* has a shape of a part of a sphere or ellipsoid. Further, each of the plurality of portions 111*b* has, for example, a shape of a hemisphere or half ellipsoid. In the example in FIG. 6B, each of the plurality of portions 111*b* has a convex shape of which the cross-sectional shape is a part of a circle or ellipse. However, each of the plurality of portions 111*b* can have a convex shape of which the cross-sectional shape is a curve. More specifically, the plurality of portions 111*b* can have a convex shape formed of a curved plane.

Figure 7:
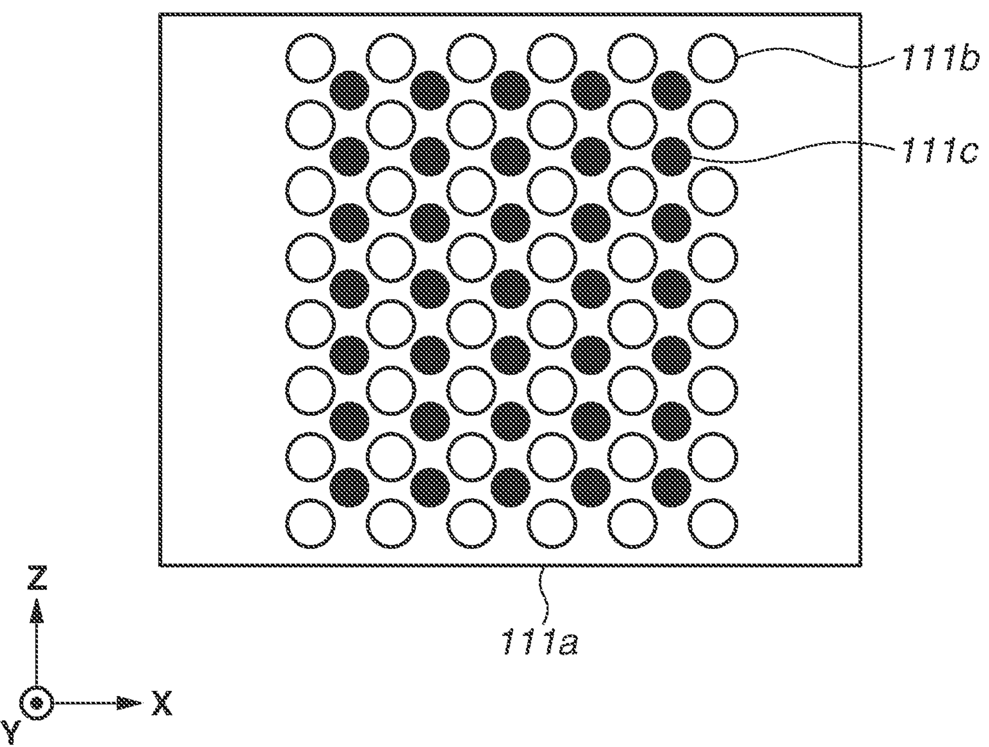
FIG. 7 illustrates a lateral plane of a part of a first housing of the light source apparatus of the second embodiment.

In addition, each of the plurality of portions 111*b* can be disposed in line not only in the X-axis or Y-axis direction but also in the Z-axis direction. FIG. 7 illustrates a part of a lateral plane of the first housing 111 of the light source apparatus 110 according to the present embodiment. As the plurality of portions 111*b*, a plurality of portions each having a convex shape is disposed in line in the X-axis and Z-axis directions.

In the above-described example, the plurality of portions 111*b* has a convex shape protruding to the inside of the first housing 111. However, the plurality of portions 111*b* can have a concave shape toward the lamp 10 (concave shape depressed out of the first housing 111).

The planar surface 111*a* of the first housing 111 is provided with a plurality of openings 111*c*. The plurality of openings 111*c* allows the space inside the first housing 111 to communicate with the space outside the first housing 111 and inside the second housing 112. Each of the plurality of openings 111*c* is disposed between the plurality of portions 111*b*. In the example in FIG. 7, one opening 111*c* is disposed between four portions 111*b*. However, one opening 111*c* can be disposed between two portions 111*b* in the X-axis and Z-axis directions.

The light emitted from the lamp 10 is reflected by the inclined plane of each of the plurality of portions 111*b* but is not reflected in a direction toward the lamp 10. Therefore, the light does not irradiate the lamp 10. The reflected light is attenuated while being diffusely reflected. The reflected light is also attenuated while repetitively being reflected inside the first housing 111. Part of the light reflected by the plurality of portions 111*b* exits the first housing 111 through the plurality of openings 111*c*. If the incident angle of the light that has exited the first housing 111 is larger than 0 with respect to the planar surface 111*a*, the light is attenuated while being reflected between the first housing 111 and the second housing 112. This reduces the possibility that the light emitted from the lamp 10 returns to the lamp 10 to irradiate the lamp 10.

As described above, in the light source apparatus 110 according to the present embodiment, each of the plurality of portions 111*b* has an inclined plane inclining with respect to the planar surface 111*a*, and none of the inclined planes of the plurality of portions 111*b* faces the lamp 10. This reduces the possibility that the light emitted from the lamp

10 returns to the lamp 10 to irradiate the lamp 10. More specifically, the plurality of portions 111*b* reduces the possibility that the light emitted from the lamp 10 returns to the lamp 10 to irradiate the lamp 10. The plurality of portions 111*b* on the first housing 111 prevents the light emitted from the lamp 10 from being reflected by the first housing 111 and irradiating the lamp 10.

The light source apparatus 110 according to the present embodiment includes a housing provided with a plurality of portions each with a convex shape having a plane inclining with respect to a planar surface facing the light source. This configuration enables reducing the possibility that the light from the light source is reflected by the housing and the light irradiates the light source, thus preventing a temperature increase of the light source.

A light source apparatus 110 according to a third embodiment will now be described. Elements not mentioned as the third embodiment are inherited from the first embodiment. A light source apparatus 110 according to the third embodiment includes the plurality of portions 111*b* disposed in line in the Z-axis direction.

Figure 8:
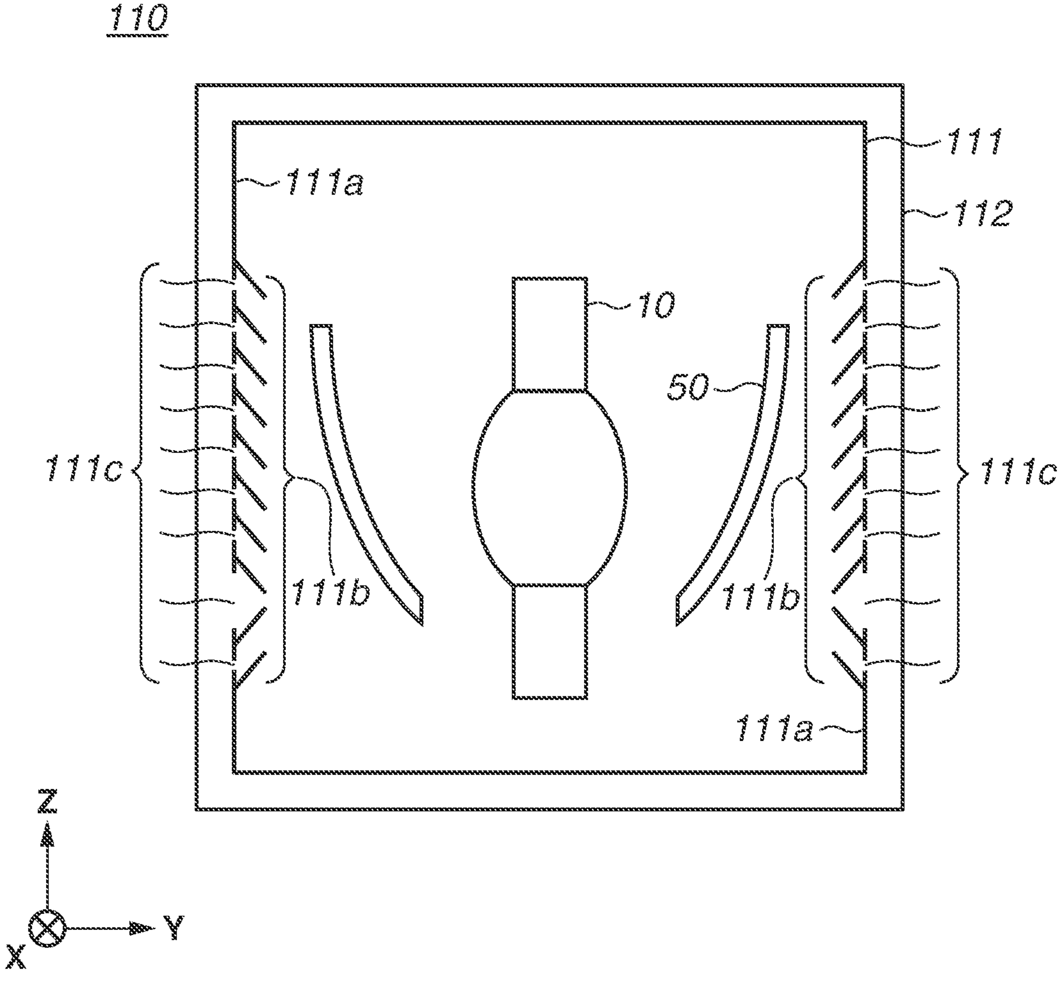
FIG. 8 illustrates a configuration of a light source apparatus according to a third embodiment.
Figure 9:
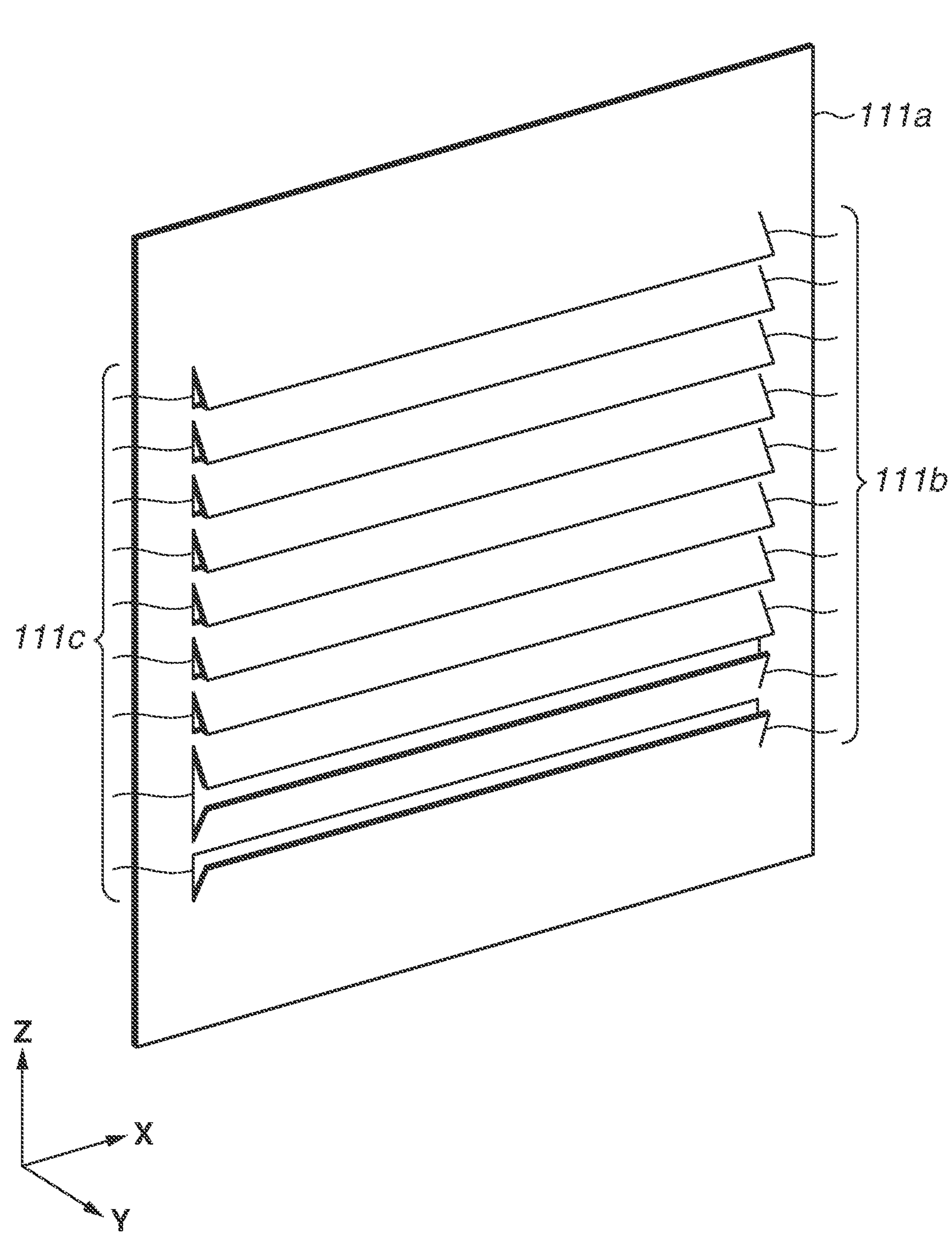
FIG. 9 is a perspective view illustrating a first housing of the light source apparatus according to the third embodiment.

FIG. 8 illustrates a configuration of the light source apparatus 110 according to the third embodiment. FIG. 9 is a perspective view illustrating the first housing of the light source apparatus 110 according to the present embodiment. The light source apparatus 110 according to the first embodiment is provided with the plurality of portions 111*b* disposed in line in the X-axis or Y-axis direction, as illustrated in FIGS. 3A and 3B. The light source apparatus 110 according to the present embodiment is provided with the plurality of portions 111*b* disposed in line in the Z-axis direction.

Each of the plurality of portions 111*b* has an inclined plane, and is disposed at such a position where the lamp 10 does not exist in the normal direction of the inclined plane. This means that none of the inclined planes of the plurality of portions 111*b* faces the lamp 10. According to the present embodiment, each of the plurality of portions 111*b* has a plate-like shape.

The first housing 111 can have a plurality of openings 111*c*. The light source apparatus 110 according to the first embodiment is provided with the plurality of openings 111*c* disposed in line in the X-axis or Y-axis direction, as illustrated in FIGS. 3A and 3B. The light source apparatus 110 according to the present embodiment, however, is provided with the plurality of openings 111C disposed in line in the Z-axis direction.

The light source apparatus 110 according to the present embodiment includes a housing provided with a plurality of portions each with a plate-like shape having a plane inclining with respect to a planar surface facing the light source. This configuration enables reducing the possibility that the light from the light source is reflected by the housing and the light irradiates the light source, thus preventing a temperature increase of the light source.

<Article Manufacturing Method>

A method for manufacturing an article, such as a device (e.g., a semiconductor device, magnetic storage media, and a liquid crystal display element), a color filter, and a hard disk will now be described. The manufacturing method includes a process for forming a pattern on a substrate by irradiating the substrate (e.g., a wafer, glass plate, and film-like substrate) with light from a light source apparatus by using a lithography apparatus (e.g., an exposure apparatus, imprint apparatus, and drawing apparatus) having the light source apparatus. Such a manufacturing method further includes a process (processing step) for processing the substrate with the pattern formed thereon. The processing step includes a step for removing the residual film of the pattern. The processing step includes a step for etching the substrate by using the pattern as a masking pattern. The processing step includes steps of dicing, bonding, and packaging as other known steps. The article manufacturing method according to the present embodiment is more advantageous in at least one of performance, quality, productivity, or production cost of the article than the conventional method.

Figure 10:
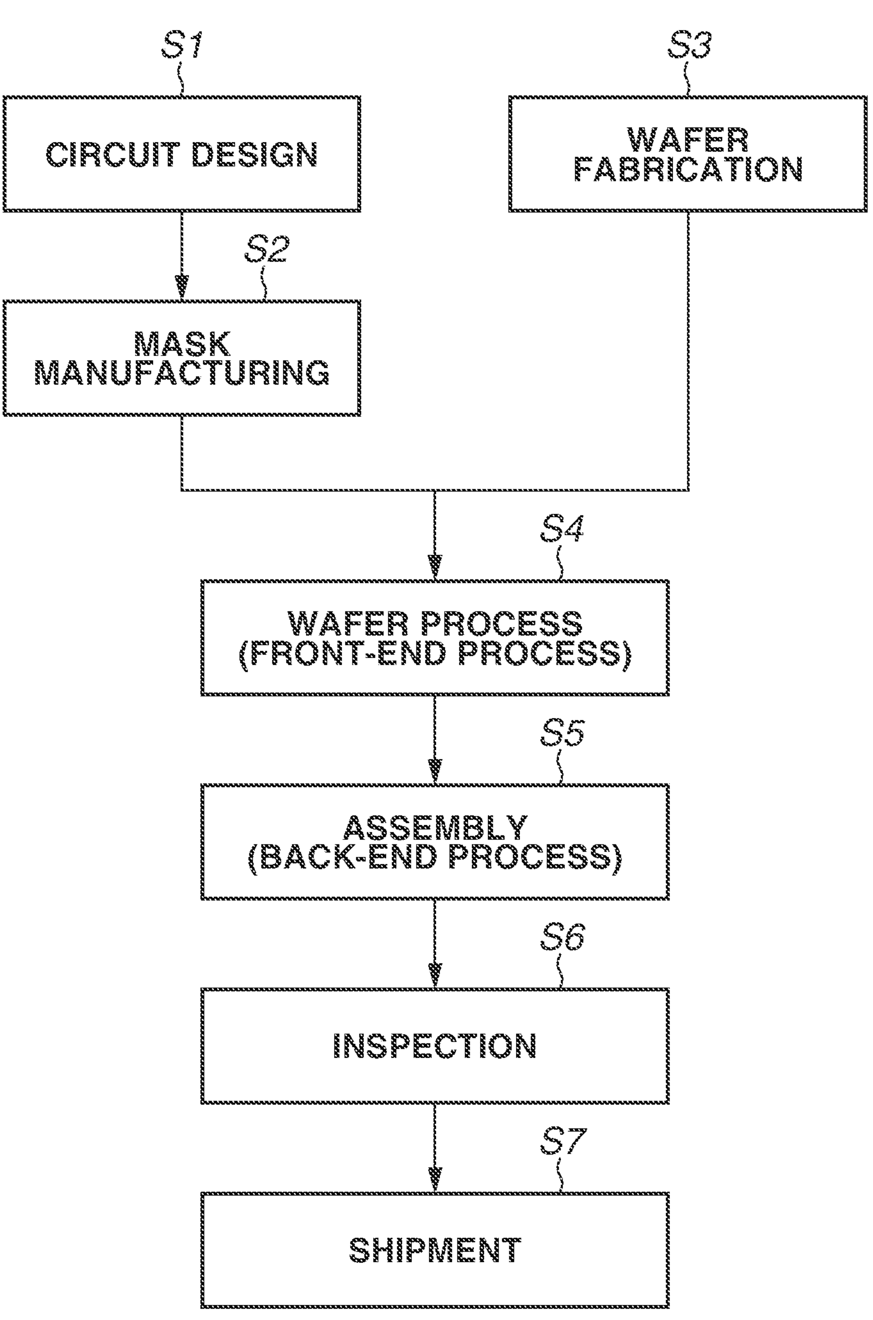
FIG. 10 is a flowchart illustrating device manufacturing using an exposure apparatus.

As an example of an article manufacturing method, an embodiment of a device manufacturing method using the above-described exposure apparatus will now be described with reference to FIGS. 10 and 11. FIG. 10 is a flowchart illustrating processes for manufacturing a device (e.g., semiconductor chip such as an integrated circuit (IC) and large-scale integrated circuit (LSI), liquid crystal display (LCD), and charge coupled device (CCD)). As an example, a method for manufacturing a semiconductor chip will be described here.

In step S1 (circuit design), the method performs circuit design of the semiconductor device. In step S2 (mask manufacturing), the method manufactures a mask (original plate) based on a designed circuit pattern. In step S3 (wafer fabrication), the method fabricates a wafer (substrate) by using a material such as silicon. In step S4 (wafer process) called a front-end process, the method forms an actual circuit on the wafer by using the mask and wafer based on the lithography technique on the above-described exposure apparatus. In step S5 (assembly) called a back-end process, the method assembles a semiconductor chip by using the wafer manufactured in step S4. This process includes assembly processes, such as assembly steps (dicing and bonding) and a packaging step (chip packaging). In step S6 (inspection), the method inspects the semiconductor device manufactured in step S5 by subjecting the device to an operation test and a durability test. Through the above-described processes, a semiconductor device is manufactured and then shipped (step S7).

Figure 11:
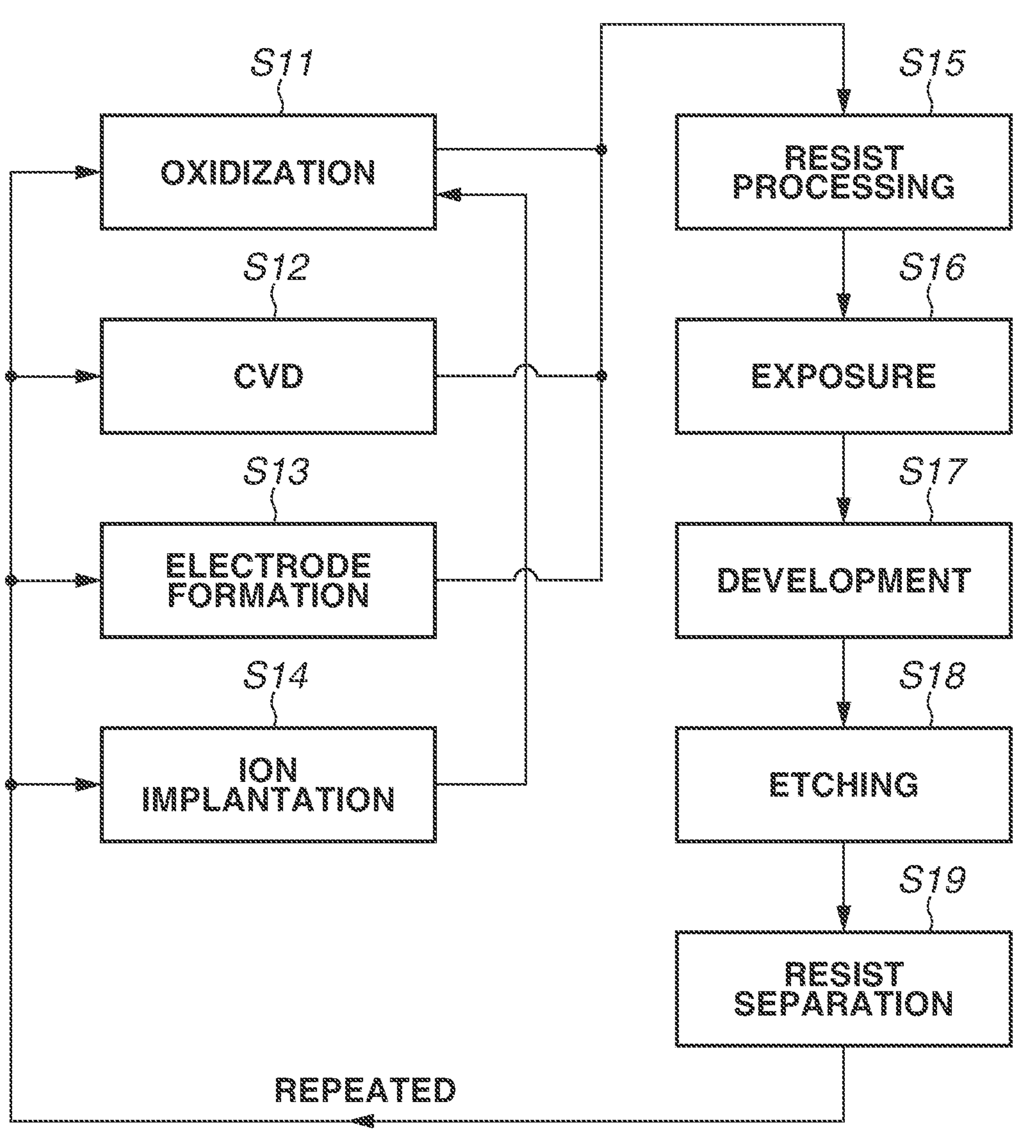
FIG. 11 is a detailed flowchart illustrating a wafer process in step 4 of the flowchart illustrated in FIG. 10.

FIG. 11 is a detailed flowchart illustrating the wafer process in step 4. In step S11 (oxidization), the method oxidizes the surface of the wafer. In step S12 (CVD), the method forms an insulator film on the surface of the wafer. In step S13 (electrode formation), the method forms an electrode on the wafer through evaporation. In step S14 (ion implantation), the method implants ions into the wafer. In step S15 (resist processing), the method applies a photosensitive agent to the wafer. In step S16 (exposure), the method exposes the circuit pattern of the mask to the wafer by using the exposure apparatus. In step S17 (development), the method develops the exposed wafer. In step S18 (etching), the method scrapes off portions other than the developed resist image. In step S19 (resist separation), the method removes unnecessary resist after completion of etching. The method repeats the above-described steps to form circuit patterns in an overlapped way on the wafer.

Although an exposure apparatus has been described above as an example of a lithography apparatus, the lithography apparatus is not limited thereto. Examples of lithography apparatuses include an imprint apparatus that forms a pattern of an imprint material on a substrate by using a mold (template) having uneven patterns. Examples of lithography apparatuses also include a flattening apparatus that forms a pattern so that the constituent on a substrate is flattened by using a mold (planar template) having planar portions without uneven patterns. Examples of lithography apparatuses further include a drawing apparatus that forms a pattern on a substrate by drawing an image on the substrate by using a charged particle beam (e.g., electron beam or ion beam) via a charged particle optical system.

Each of the first to the third embodiments is implemented on a stand-alone basis. Any of the first to the third embodiments can also be implemented in combination.

The present disclosure makes it possible to provide a light source apparatus for preventing a temperature increase of a light source, a lithography apparatus, and an article manufacturing method.

While the present disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of priority from Japanese Patent Application No. 2022-106241, filed Jun. 30, 2022, which is hereby incorporated by reference herein in its entirety.

What is claimed is:

1. A light source apparatus comprising:
- a light source, to form a pattern during lithography on a substrate; and
- a first housing configured to store the light source,
- wherein a plurality of openings communicating with an outside of the first housing is formed in the first housing,
- wherein the first housing includes a plurality of portions, each having a surface inclining with respect to a planar surface of the first housing,
- wherein at least one of the plurality of portions reflects light from the light source, causing the reflected light to exit the first housing through at least one of the plurality of openings, and
- wherein the plurality of openings extend from a space inside of the first housing to a space between the first housing and a second housing surrounding at least a portion of the first housing.

2. The light source apparatus according to claim 1, wherein each of the plurality of portions has a plate-like shape.

3. The light source apparatus according to claim 2, wherein at least two of the plurality of portions are disposed on the planar surface such that each plate-like shape of at least two of the plurality of portions are parallel to each other.

4. The light source apparatus according to claim 3, wherein:
- at least two portions of the plurality of portions are disposed on the surface such that the at least two portions are parallel to each other and disposed at a first angle,
- another at least two portions of the plurality of portions are disposed on the planar surface such that the another at least two portions are parallel to each other and disposed at a second angle, and
- the first angle is different from the second angle.

5. The light source apparatus according to claim 1, wherein each of the plurality of portions has a convex shape or a concave shape toward the light source.

6. The light source apparatus according to claim 1, wherein each of the plurality of portions has a convex shape of a cone or a pyramid.

7. The light source apparatus according to claim 1, wherein each of the plurality of portions has a convex shape or a concave shape formed of a curved plane.

8. The light source apparatus according to claim 1, wherein the planar surface of the first housing and surfaces of the plurality of portions each of which include the inclined surface are colored black.

9. The light source apparatus according to claim 1, wherein each of the plurality of openings is disposed between at least two portions of the plurality of portions.

10. The light source apparatus according to claim 1, wherein a mirror for focusing the light from the light source is provided.

11. The light source apparatus according to claim 10, wherein the mirror is a cold mirror.

12. The light source apparatus according to claim 11, wherein the cold mirror includes a thin optical film configured to transmit long-wavelength light and reflect short-wavelength light.

13. A lithography apparatus including the light source apparatus according to claim 1, wherein the lithography apparatus forms the pattern on the substrate by using the light source apparatus.

14. An article manufacturing method comprising:
- forming the pattern on the substrate by using the lithography apparatus according to claim 13; and
- manufacturing an article using the substrate with the pattern formed on the substrate.

15. A light source apparatus comprising:
- a light source;
- a first housing configured to store the light source;
- a planar surface of the first housing including a plurality of openings communicating with an outside of the first housing;
- a plurality of portions, disposed on the planar surface, each having a plane inclining with respect to the planar surface, wherein at least one of the plurality of portions reflects light from the light source, causing the reflected light to exit the first housing through at least one of the plurality of openings; and
- a second housing provided outside the first housing, wherein the plurality of openings allows a first space in the first housing to communicate with a second space between the first housing and the second housing.

16. The light source apparatus according to claim 1, wherein the plurality of openings are configured to prevent temperature increase of the light source.

17. The light source apparatus according to claim 15, wherein an inner surface of the second housing is colored black.

18. A light source apparatus comprising:
- a light source;
- a first housing including a plurality of openings in a surface thereof;
- a second housing surrounding at least a part of the first housing; and
- a plurality of portions, wherein:
- the light source is positioned within the first housing,
- each opening of the plurality of openings extends from the first housing to the second housing,
- each portion of the plurality of portions is inclined with respect to the surface,
- at least one portion of the plurality of portions is configured to reflect light from the light source, and
- the reflected light exits the first housing through the at least one of the plurality of openings.

* * * * *